United States Patent [19]

Brust

[11] Patent Number: 4,745,362
[45] Date of Patent: May 17, 1988

[54] METHOD AND APPARATUS FOR DETECTING AND IMAGING A VOLTAGE SIGNAL OF AT LEAST ONE SPECIFIC FREQUENCY AT A MEASURING LOCATION

[75] Inventor: Hans-Detlef Brust, Dudweiler, Fed. Rep. of Germany

[73] Assignee: Siemens Aktiengesellschaft, Berlin and Munich, Fed. Rep. of Germany

[21] Appl. No.: 717,115

[22] Filed: Mar. 28, 1985

[30] Foreign Application Priority Data

May 30, 1984 [DE] Fed. Rep. of Germany ....... 3420272

[51] Int. Cl.4 ............................................ G01N 23/00
[52] U.S. Cl. ............................ 324/158 R; 324/158 R; 324/158 D; 250/310; 250/311
[58] Field of Search ............... 250/310, 311, 397, 492; 324/158 R, 158 D, 71.5

[56] References Cited

U.S. PATENT DOCUMENTS

| | | | |
|---|---|---|---|
| 4,169,229 | 9/1979 | Feuerbaum | 250/311 |
| 4,220,853 | 9/1980 | Feuerbaum et al. | 250/31 D |
| 4,220,854 | 9/1980 | Feuerbaum | 324/158 D |
| 4,277,679 | 7/1981 | Feuerbaum | 324/158 D |
| 4,286,154 | 8/1981 | Okubo et al. | 250/310 X |
| 4,292,519 | 9/1981 | Feuerbaum | 250/310 |
| 4,413,181 | 11/1983 | Feuerbaum | 324/158 D |
| 4,420,686 | 12/1983 | Onoguchi et al. | 250/310 X |
| 4,581,534 | 4/1986 | Todokoro et al. | 324/158 D |

OTHER PUBLICATIONS

"Voltage Coding: Temporal Versus Spatial Frequencies," Lukianoff et al, Scanning Electron Microscopy, Apr. 1975.

"Une Alternative Economique Au Contraste De Potentiel Stroboscopique: Le Traitement Du Signal D'Electrons Secondaries D'un Microscope A Balayage," Collin, Journees D'Electronique 1983, pp. 283-298—Jul. 1983.

Primary Examiner—Reinhard J. Eisenzopf
Assistant Examiner—Vinh P. Nguyen
Attorney, Agent, or Firm—Hill, Van Santen, Steadman & Simpson

[57] ABSTRACT

A method and apparatus for detecting and imaging a voltage signal of at least one specific frequency at a measuring location of a test object, such as an integrated circuit, employ a scanning particle or radiation microscope for generating a voltage contrast signal whereby primary particles or radiation are pulsed or otherwise intensity-modulated with at least one specific frequency which frequency is different from at least one frequency of the signal at the test location. The voltage contrast signal is mixed to a specific intermediate frequency and the resulting mixed signal is demodulated. The method and apparatus can be utilized to identify faulty electronic modules.

29 Claims, 5 Drawing Sheets

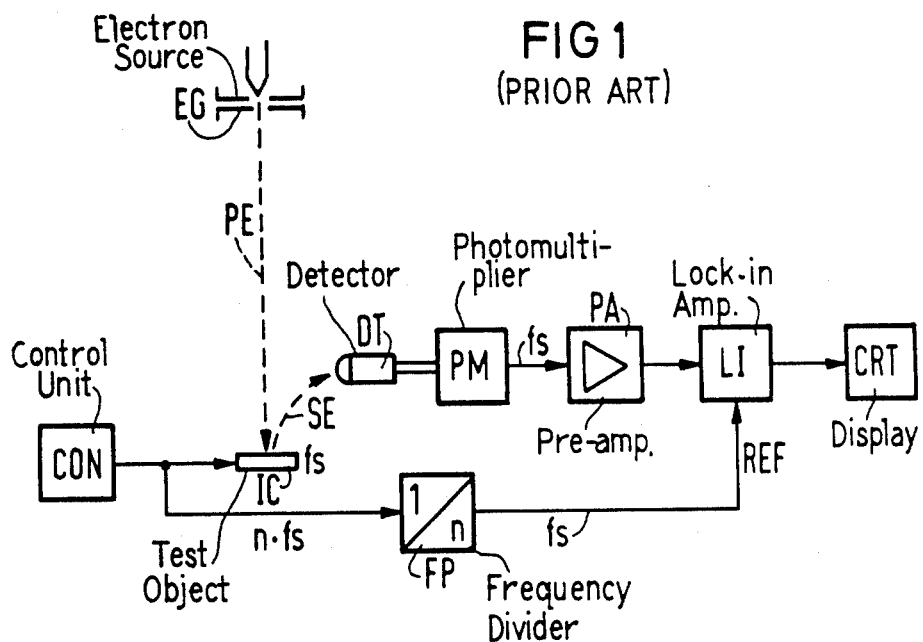
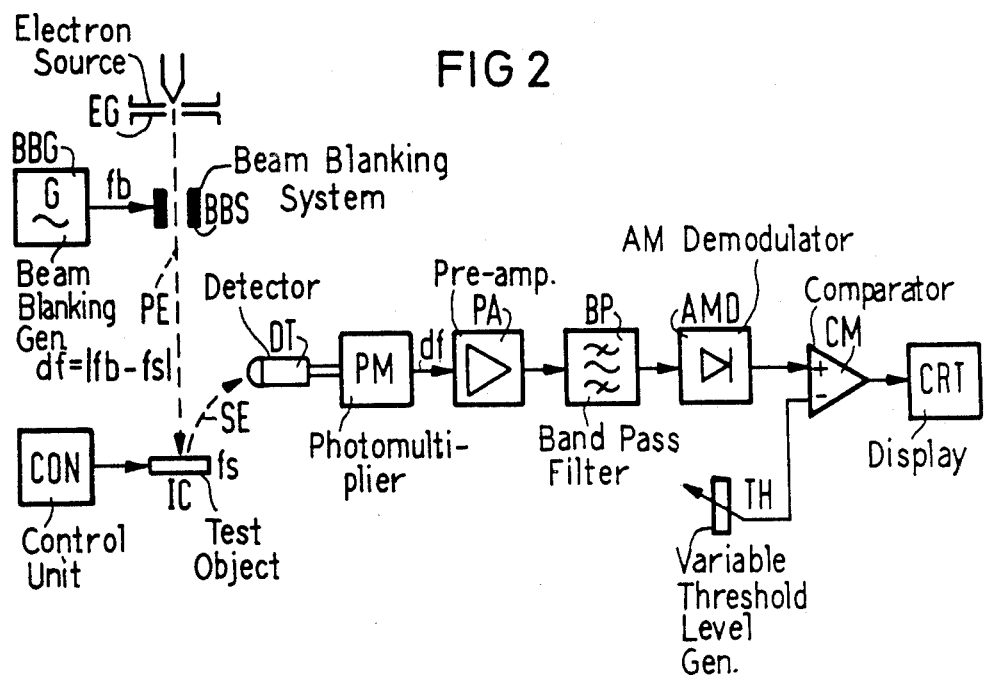

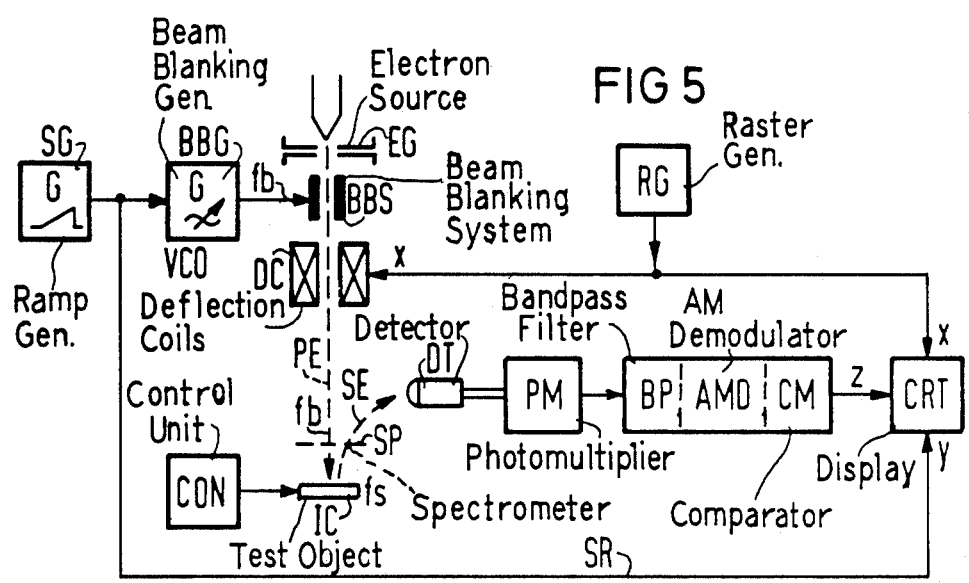
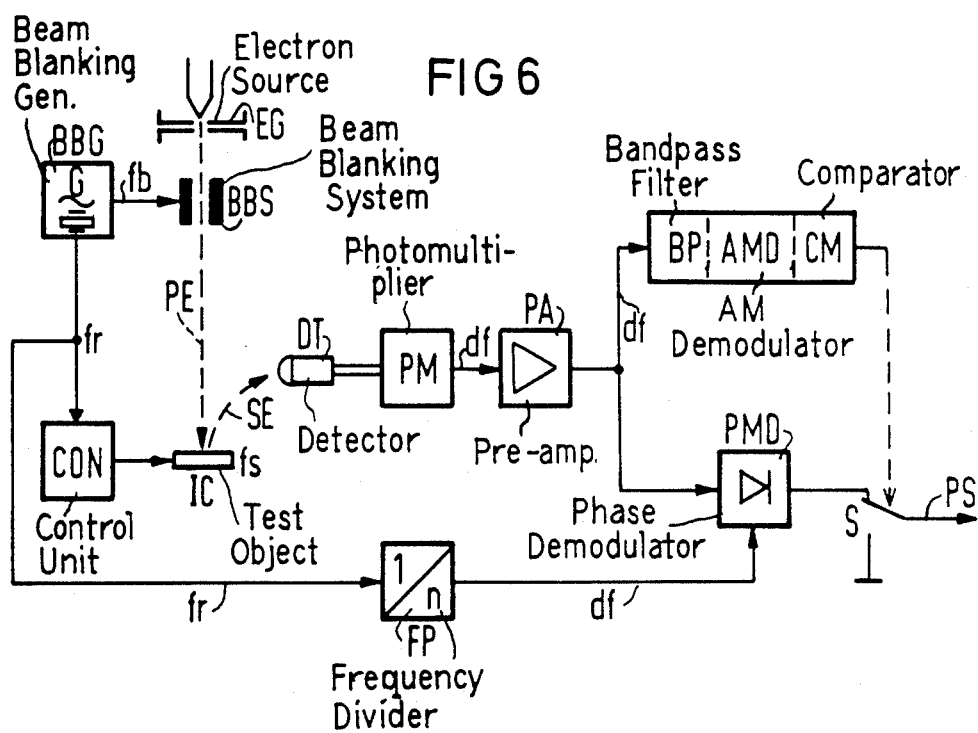

METHOD AND APPARATUS FOR DETECTING AND IMAGING A VOLTAGE SIGNAL OF AT LEAST ONE SPECIFIC FREQUENCY AT A MEASURING LOCATION

BACKGROUND OF THE INVENTION

1. Field of the Invention

The present invention relates to a method and apparatus for detecting and/or imaging a voltage signal of at least one specific frequency at a measuring location of a test object utilizing a scanning particle or radiation microscope.

2. Description of the Prior Art

In testing and analyzing integrated circuits for faults, it is useful to compare the behavior of the integrated circuit in question with the rated behavior derived from a simulation of the correct operation of the circuit in order to locate an error or fault. For this purpose, among other tests, a check must be performed to determine whether specific internal periodic signals of different frequencies are present at a particular measuring location within the integrated circuit.

Methods for undertaking such a check which are known in the art may be classified generally into three basic methods. The method of so-called "voltage coding" is known from the article "Voltage Coding: Temporal Versus Spatial Frequencies", Lukianoff et al, Scanning Electron Microscopy/1975 (Part I), Proceedings of the Eighth Annular Scanning Electron Microscope Symposium, Chicago, IIT Research Institute, pages 465–471. The "voltage coding" method generates an image of the dynamic distribution of voltage signals of an integrated circuit on a television monitor. The "voltage coding" method enables a chronological allocation of the respective switching status of the various components and is therefore particularly suited for fast function testing of integrated circuits. The "voltage coding" method, however, has disadvantages due to the line frequency of the electron beam.

So-called "logic state mapping" is known from U.S. Pat. No. 4,223,220. The "logic state mapping" method generates an image of the dynamic distribution of voltage signals by means of a stroboscope effect. Compared to the "voltage coding" method, the "logic state mapping" method supplies a time resolution which is higher by several orders of magnitude given the same voltage resolution. The "logic state mapping" method also simplifies registration, because the images of the dynamic distribution of the voltage signals can be directly photographed from the picture screen of a scanning electron microscope. In the "voltage coding" method, however, registration of the dynamic distribution of voltage signals is only possible with a tape storage or with photographs taken from a television monitor.

A third known method is described in the article "Une Alternative Economique au Contraste de Potentiel Stroboscopique: Le Traitement du Signal d'Electrons Secondaires d'un Microscope a Balayage", Collin, appearing in Proc. of Journees d'Electronique 1983, "Testing Complex Integrated Circuits: A Challenge" published by the Swiss Federal Institute of Technology, Lausanne, Switzerland at pages 283–298. In this method detection of specific frequencies at a measuring location in an integrated circuit is executed by the use of a "lock-in" amplifier. The "lock-in" amplifier is employed to filter out a signal having the frequency in question from a voltage contrast signal acquired at a measuring location in the integrated circuit. The intensity of this signal is imaged as brightness fluctuation. In this known method, the electron beam is not pulsed.

This third known method has two disadvantages, the first being that "lock-in" amplifiers generally exhibit a highly limited output bandwidth in amplitude measurement (the input bandwidth of a "lock-in" amplifier is generally higher than the output bandwidth, so that the limitation of bandwidth at the output does not result in an enhancement of the sensitivity). The limited output bandwidth of a "lock-in" amplifier in the third known method requires long picture exposure times which may last several minutes (such as, for example, 3 through 20 minutes) and further causes a high load on the specimen making this method not well suited for routine use when seeking a signal having a specific frequency in an integrated circuit. The second disadvantage of the third known method is that the maximum operating frequency is limited by the limit frequency of the "lock-in" amplifier, and is also limited by the limit frequency of the signal chain of the scanning electron microscope which is employed. for an Ithaco "lock-in" amplifier type 391A, for example, the limit frequency is 200 kHz. For an ETEC Autoscan II scanning electron microscope, the limit frequency of the signal chain, which essentially consists of a detector, a photomultiplier and a pre-amplifier, is in the range of approximately 1 to 2 MHz. Such a scanning electron microscope is described, for example, in U.S. Pat. No. 4,277,679. Higher operating frequencies cannot be attained with this third known method so that under certain conditions the integrated circuits in question cannot be investigated at their operating frequency. For example, integrated bipolar circuits and numerous MOS circuits have operating frequencies higher than 2 MHz.

Thus the three methods known in the art can only be implemented with difficulty, and when implemented, permit a check of only a few locations or nodes of the integrated circuit and are further greatly limited in their range of operating frequencies, often making a check of an integrated circuit under normal operating conditions impossible. Such methods are furthermore very slow and presume that the frequency of the signal in question is known, or that a signal synchronous with the signal in question is externally accessible. If the frequency of the signal in question is not known, the search for such a signal becomes very tedious and complex. This is the case, for example, if the frequency of the signal in question is achieved by means of division by 255 instead of division by 256.

SUMMARY OF THE INVENTION

It is an object of the present invention to provide a method and apparatus for undertaking a fast internal check of a measuring location of an integrated circuit at which a signal of a specific frequency is expected to be present. The above object is inventively achieved in a method and apparatus wherein the primary particles or radiation of a scanning particle or radiation microscope are pulsed or otherwise intensity-modulated with at least one specific frequency, this frequency being different from at least one frequency of the voltage signal in question at the test location, and a voltage contrast signal is derived which is mixed to a signal having a frequency which is the difference between the pulsing or modulating frequency and the frequency of the signal in question. The mixed voltage contrast signal is then demodulated.

As used herein the term "modify" will be generically used to refer to an operation on the particle or radiation beam which encompasses both pulsing and intensity-modulation. As discussed below, any one of the primary beam, the secondary beam, or the electronic signal derived from the secondary beam can be modified.

In comparison to the aforementioned known methods, the method disclosed herein permits a significantly faster circuit check to be undertaken, thereby placing less of a load on the specimen, and is usable up to extremely high operating frequencies, thus enabling routine utilization of the method under many conditions. The method and apparatus disclosed herein enable a fast, large-surface execution of a check of an integrated circuit under normal operating conditions when the frequency of the signal in question at the test location is known, and moreover enable a fast representation of the various signal frequencies occuring within an integrated circuit when one or more of the frequencies of the signals in question are not known.

The particle or radiation beam generated by the scanning particle or radiation microscope is pulsed or intensity-modulated, as stated above. The pulsing or modulating frequency is slightly offset with respect to the frequency of the signal in question at the test location, with the voltage contrast signal arising at the surface of the integrated circuit being mixed to a frequency which is equal to the difference of these two frequencies. This fixed intermediate frequency can then be easily filtered out by means of a band pass filter and subsequently demodulated. Because the signal chain of the scanning particle or radiation microscope needs only transmit the relatively low fixed intermediate frequency, extremely high frequency signals can be detected or imaged as may arise in an integrated circuit.

The frequency spectrum under consideration can be entirely covered by means of varying the frequency with which the particle beam is blanked or intensity-modulated around a center frequency, if the frequency of the signal in question at the test location is not known. The frequencies occurring at various measuring locations or at a node can thus be easily identified.

DESCRIPTION OF THE DRAWINGS

FIG. 1 is a schematic view of an apparatus for detecting and imaging a voltage signal at a test location constructed in accordance with the prior art;

FIG. 2 is an apparatus for detecting and imaging a voltage signal at a test location constructed in accordance with the principles of the present invention and practicing the method disclosed herein wherein the primary beam is modified;

FIG. 5 is a schematic block diagram of a further embodiment of an apparatus constructed in accordance with the principles of the present invention;

FIG. 6 is a schematic block diagram of a further embodiment of an apparatus constructed in accordance with the principles of the present invention.

DESCRIPTION OF THE PREFERRED EMBODIMENTS

Figure 3A:
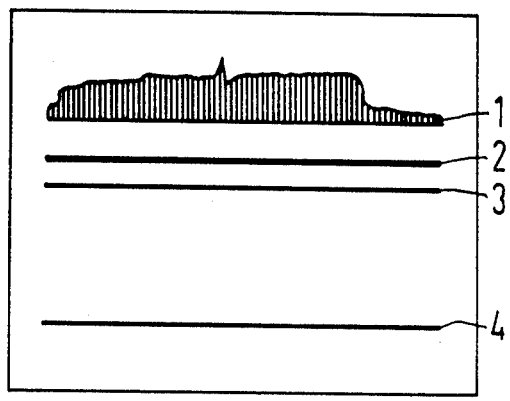
FIGS. 3A and 3B show output signals obtained with the apparatus shown in FIG. 2.

An apparatus of the type known in the art for detecting and imaging a voltage signal obtained from a measuring location of a test object in accordance with known methods is shown in FIG. 1, and various embodiments of an apparatus for undertaking such testing constructed in accordance with the principles of the present invention are shown in FIGS. 2, 5 and 6. Elements common to all Figures are referenced with identical reference symbols.

In the following discussion, the various illustrative embodiments refer to an electron microscope, however, it will be understood by those skilled in the art that ions or other particles or radiation such as laser radiation may be used instead of electrons, both as the primary particles or radiation as well as the secondary particles or radiation.

The terms "particle beam" and "particles" as used herein therefore generically encompass, for example, laser radiation, wherein the particles are photons.

The apparatus shown in FIG. 1 is for implementing the aforementioned known method described in the article by Collin. An electron source EG generates a beam of primary electrons PE which are incident at a measuring location, such as a node of a test object IC, such as an integrated circuit. Secondary electrons SE are thereby generated at that location. The secondary electrons SE are detected in a detector DT. In the dependence upon the secondary electron current which impinges the detector DT, a secondary electron signal is generated which is supplied to a photomultiplier PM and is amplified therein. The amplified secondary electron signal is conducted further to a pre-amplifier PA wherein the signal is further amplified. The signal finally proceeds to a "lock-in" amplifier LI. The output signal of this "lock-in" amplifier LI may, for example, control the intensity of an electron beam in a display device CRT, such as a picture tube.

The test object IC is driven or operated with a signal having a frequency n·fs, obtained from a control unit CON. This signal is also supplied to a frequency divider FP. If a measuring location within the test object IC which is to be checked has a signal at the frequency fs, the frequency divider FP divides the signal having the frequency n·fs by n. A signal having the frequency fs is thus obtained at the output of the frequency divider FP, and is supplied to the "lock-in" amplifier LI as a reference signal REF.

If the primary electron beam PE is incident at a measuring location at which a signal having the frequency fs is present, the secondary electron signal eventually supplied to the "lock-in" amplifer LI will also have a frequency component fs. The signal component having the frequency fs is filtered out of the secondary electron signal by the "lock-in" amplifier LI. The amplitude of this filtered signal component having the frequency fs may be utilized to control the intensity of the electron beam in the display CRT of a scanning electron microscope.

An apparatus constructed in accordance with the principles of the present invention for detecting and/or imaging a signal at a measuring location is shown in FIG. 2. A scanning electron microscope as described in U.S. Pat. Nos. 4,220,853; 4,220,854; or 4,277,679 may be utilized as the scanning particle microscope in the embodiment shown in FIG. 2 (as well as in the embodiments shown in FIGS. 5 and 6) for quantitative measurement of the voltage signal. A scanning electron microscope as described in U.S. Pat. No. 4,223,220 may be utilized in these embodiments for undertaking a qualitative measurement of the voltage signal. The method and apparatus described below may be utilized to undertake a check or measurement of any type of test specimen or object having a measuring location at which a signal having a specific frequency is expected to be present, and is not limited to testing integrated circuits.

In contrast to the method and apparatus described in connection with FIG. 1, the primary electron beam PE and the method and apparatus operating in accordance with the principles of the present invention is modified by being blanked or intensity-modulated (plused) by means of a beam blanking or modulating system BBS at a blanking or modulating frequency fb. A suitable beam blanking system is described, for example, in U.S. Pat. No. 4,169,229. The beam blanking or modulating system BBS is driven at the frequency fb by a beam blanking generator BBG. The frequency fb is offset from the expected frequency fs of the signal in question at the test location by a difference frequency df. The difference frequency df is equal to the absolute value of the difference between the frequencies fb and fs. Because the primary electron beam PE is pulsed or intensity-modulated at the specific frequency fb, a stroboscopic imaging or detection is obtained. When the measuring location has a signal present having the frequency fs, and when the primary electron beam PE is pulsed with the frequency fb, the secondary electron signal will have a component having the frequency df. The secondary electron signal proceeds through a detector DT, a photomultiplier PM, and a pre-amplifier PA to a bandpass filter BP. the bandpass filter BP has the frequency df as its center frequency. The bandpass filter BP therefore precisely filters the frequency component df out of the frequency spectrum of the secondary electron signal SE. In practical testing of an apparatus of the type shown in FIG. 2, a bandpass filter BP having a center frequency of 50 kHz, a bandwidth of 3 kHz and edges steeply descending to the attenuation range was employed. The portion of the secondary electron signal permitted to pass through the bandpass filter BP is demodulated by an AM demodulator AMD, and is supplied to the positive or non-inverting input of a comparator CM. The negative or inverting input of the comparator CM is connected to a variable threshold level generator TH. The output of the comparator CM controls the intensity of the electron beam of a display CRT, such as a picture tube, which may be a component of the scanning electron microscope employed in the apparatus of FIG. 2.

For purpose of comparison, signal outputs from the apparatus of FIG. 2 are shown in FIG. 3 first with and then without the frequency offset of the blanking frequency fb relative to the frequency fs of the signal at the measuring location.

Figure 3B:
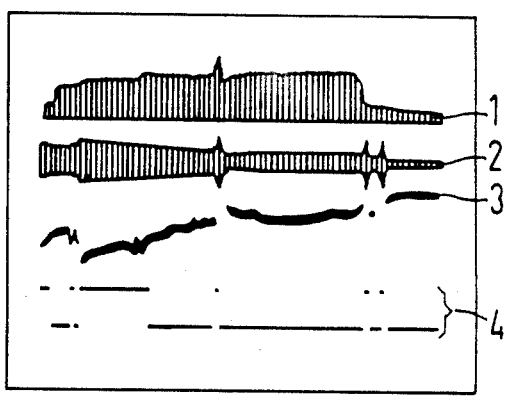

FIG. 3A shows the signal curves in a signal chain of an apparatus of FIG. 2 wherein the frequencies fs and fb coincide. FIG. 3B shows the signal curves in the signal chain of an apparatus of FIG. 2 wherein the blanking frequency fb differs by the frequency df from the frequency fs at the measuring location. In both FIGS. 3A and 3B, the signal following the pre-amplifier PA is referenced at 1, the signal at the output of the bandpass filter BP is referenced at 2, the signal at the output of the demodulator AMD is referenced at 3, and the output signal of the comparators CM is referenced at 4. As may readily be seen from FIG. 3A, the bandpass filter BP permits no component of the secondary electron signal to pass when the blanking frequency fb and the frequency fs of the signal at the measuring location are the same. In contrast thereto, as shown in FIG. 3B, an increased value is always shown at the output signal of the comparator CM when a signal component having the frequency df is present to a sufficient degree in the secondary electron signal and, consequently, can pass through the bandpass filter BP.

A bandpass filter BP having a fixed center frequency df was always employed in the generation of the signals shown in FIGS. 3A and 3B. Apart from signal components resulting from noise, which can be eliminated by appropriate selection of the threshold level by the variable threshold level generator TH, no signal component from the secondary electron signal can pass through the bandpass filter BP, and therefore the output signal 3 of the demodulator AMD and the output signal 4 of the comparator CM are always zero.

In FIG. 3B, the absolute value of the difference between the frequencies fs and fb is always equal to the center frequency df of the bandpass filter BP. Accordingly, the output signal 2 of the bandpass filter BP will always differ from zero. This means that the electron beam itself always mixes to the fixed intermediate frequency df. In the embodiment which was utilized to drive FIG. 3B, the response threshold generated by the variable threshold level generator TH was two volts, therefore the output signal 4 of the comparator CM differs from zero only when the amplitude of the output signal 2 of the band pass filter BP exceeds a specific value. A threshold selected in this manner assures better contrast in the imaging.

Figure 4A:
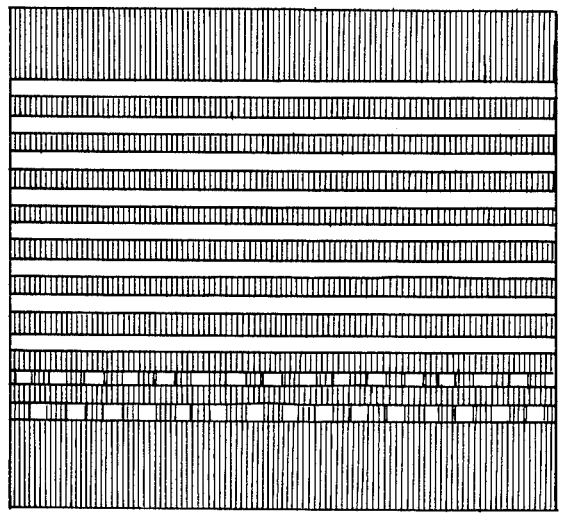
FIGS. 4A and 4B compare the imaging of the nodes of a microprocessor obtained with the prior art apparatus and the apparatus disclosed herein.
Figure 4B:
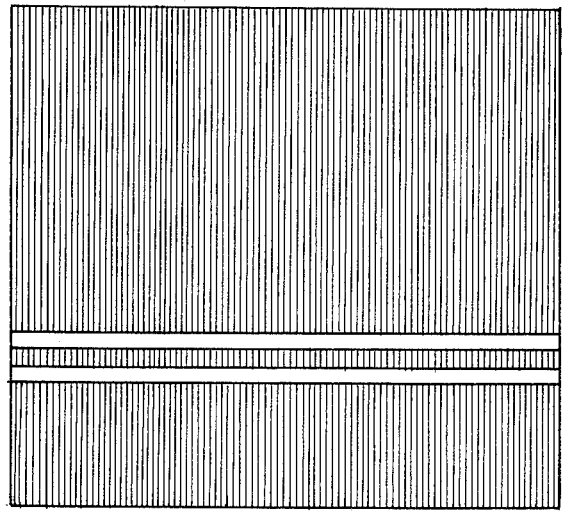

Two output signals showing the interconnectious of a microprocessor (microprocessor 8086) are shown in FIGS. 4A and 4B. FIG. 4A shows a portion of the surface of a microprocessor to two clock lines at which a clock frequency of 1 MHz is present. FIG. 4A was generated by a method known in the art, such as the method disclosed in U.S. Pat. No. 4,223,220. FIG. 4B shows a comparable diagram obtained by the method of the present invention. In this diagram, only those locations at which the clock frequency of 1 MHz is present appear light, whereas the rest of the surface of the microprocessor remains dark. The frequency fs is thus prescribed as the clock frequency of the microprocessor and is equal to 1 MHz. In the illustrated test, the blanking frequency fb of the primary electron beam PE was fs+df. As already stated above, a bandpass filter BP having a center frequency df of 50 kHz may be used.

In the method and apparatus disclosed herein, the recording times are essentially dependent on the bandwidth of the bandpass filter BP and of the AM demodulator AMD. In the installation for which the above results were recorded, these recording times were between 20 seconds and 60 seconds, thus permitting routine employment of the method and apparatus in a wide variety of testing. Moreover, due to the short exposure time and because of the pulsing of the primary electron beam PE, the energy dose with which the test object is charged is substantially diminished, thereby damage to the specimen is avoided. The highest frequency fs detectable with the method and apparatus disclosed herein is defined by the limit frequency of the beam blanking system BBS, and is on the order of 1 GHz. This permits integrated circuits to be tested at their actual operating frequencies.

For better orientation in the two-dimensional imaging of a test object, it may be preferable to add the secondary electron topography signal or another topography signal in attenuated form to the output signal of the comparator CM. The manner of generating such a secondary electron topography signal or another topography signal is available in many textbooks relating to scanning electron microscopy, and is therefore well known to persons skilled in this technology.

A further embodiment of an apparatus for practicing the method disclosed herein is shown in FIG. 5, in which a spectral analysis of the signal at the measuring location can be undertaken. If two-dimensional representation is not required, but an interest exists only in the behavior of a few measuring locations, a form of spectral analysis can be achieved. For this purpose, the electron beam PE is continuously scanned across the test object IC along a line, while the beam blanking generator BBG controlling the beam blanking or modulating system BBS simultaneously sweeps the frequency range in question. For this purpose, a ramp generator SG generates a voltage signal (ramp) SR which is proportional to the frequency fb. The voltage SR is also utilized to deflect the electron beam in the display CRT in the y-direction. Whenever the blanking or modulating frequency fb reaches a value for which the absolute value of the difference between the blanking or modulating frequency fb and the frequency fs is equal to the center frequency df of the bandpass filter BP, a bright bar appears on the screen of the picture tube of the display CRT, and thus a representation is obtained of those frequencies fs at the measuring locations along the scanned line in the x-direction.

Deflection of the primary electrons PE along a line in the x-direction and deflection of the electron beam in the picture tube of the display CRT in the x-direction are achieved by a raster generator RG which generates a deflection signal x. Deflection coils DC are driven with the signal x for deflecting the primary electrons PE along a line in the x-direction.

In the apparatus of FIG. 5, the beam blanking generator BBG controlling the beam blanking or modulating system BBS is a voltage controlled oscillator VCO. In voltage controlled oscillators, a voltage-to-frequency conversion takes place, so that such oscillators are sometimes referred to as voltage-to-frequency converters.

The drive for the intensity modulation of the electron beam in the picture tube of the display CRT occurs through a signal chain as in the apparatus of FIG. 2, including a detector DT, a photomultiplier PM, and a schematically represented bandpass filter, AM demodulator, and comparator. The bandpass filter has a center frequency df. The output of this signal chain, namely the output of the comparator CM, controls the intensity modulation of the electron beam in the display CRT. For quantitative measurement, a spectrometer SP as described, for example, in U.S. Pat. No. 4,292,519 may also be included in the scanning electron microscope.

The primary electron beam PE need not necessarily be scanned along a line. The primary electron beam PE may continually skip among a number of measuring locations. In both cases, deflection of the primary electron beam PE across an interrelated group of measuring locations should occur so slowly that the frequency fb varies in totality by less than the bandwidth of the bandpass filter or the demodulator (whichever is the lesser of the two during the scanning of the total group of interrelated measuring locations.

The rapidity of the primary beam deflection and modification of the frequency fb may, however, be reversed. The primary beam deflection may occur either continuously or by skipping between a number of measuring locations, in which case the primary electron beam will first be positioned to a first measuring location and the frequency range in question will be swept. The primary electron beam will then be continuously or discontinuously positioned to successive measuring locations at which locations the blanking or modulating frequency fb will again be swept across the frequency range in question.

If the analog output signal of the AM demodulator AMD is used when the blanking or modulating frequency fb is varied across a frequency range in question, instead of the digital output signal of the comparator CM, a real spectral analysis may be undertaken to distinguish fundamental oscillations and harmonic oscillations of the signals at a measuring location on the basis of the intensity of the individual Fourier components. For the purpose of such a display, the ramp signal SR proportional to the frequency fb is supplied to the picture tube of the display CRT in the x-direction, and the signal level of the respective Fourier components are supplied in the y-directions. Under certain conditions, this may be undertaken discontinuously or continuously for a plurality of measuring locations by means of discontinuous or continuous deflection of the primary electron beam PE relative to the surface of the test object. Because of the topical dependency of the voltage contrast signal (of the secondary electron signal), only the signal levels for the same measuring location may be compared in the apparatus of FIG. 5 without the spectrometer SP. If the spectrometer SP is used in the apparatus of FIG. 5, the signal levels at different measuring locations may also be compared by undertaking such a frequency analysis. If a frequency analysis is undertaken using a spectrometer SP, the primary electron beam PE may either successively scan a plurality of measuring locations at the substantially constant blanking frequency fb, and subsequently execute the same procedure for a blanking frequency differing therefrom at the same series of locations, or the primary electron beam may first scan a first measuring location with the frequency range for the frequency fb being swept at this first measuring location, and subsequently repeat the same procedure at each different measuring location. The intensity with which a specific frequency is present at different measuring locations can thus be determined.

The embodiment of the apparatus shown in FIG. 6 permits an additional phase analysis of a signal at a measuring location to be undertaken. In addition to the amplitude information, phase information of the signals present at various measuring locations may also be used, at least given a constant blanking or modulating frequency fb. A phase demodulator PMD is employed for this purpose. The phase demodulator PMD may, for example, be a phase-locked loop of the type well known to those skilled in the art, for example, used in a frequency synthesis system for television sets. A phase-locked loop circuit enables a true synchronous demodulation. The phase demodulator PMD is synchronously supplied with the reference frequency df from the generator BBG or from the control unit CON. In order to obtain an output phase signal PS at only the desired frequency fs, the output of the phased democulator PMD is switched by a switch S, which is controlled by an amplitude signal received from the signal chain described in connection with earlier embodiments. In this operating mode, the beam blanking or modulating and the drive of the test object IC must be synchronized. This is accomplished in the embodiment of FIG. 6 by a common reference frequency fr.

If the primary electron beam PE is deflected along a line in the apparatus of FIG. 6, the phase signal PS can be superimposed over the location of the deflection in an arbitrary registration apparatus which need not necessarily be a picture tube but may, for example, be a plotter. If a computer is available, the phase signal may also be entered as a function of two locus variables (x, y). The electron beam may be discontinuously or continuously deflected from one measuring location to another.

The reference frequency df required for a phase-locked loop circuit of the type which may be used as the phase demodulator PMD may be acquired, for example, by suitably dividing the internal reference frquency fr from the generator BBG by a frequency divider FP, or the signal having the frequency fr may directly acquired from the control unit.

The output signal of the AM demodulator AMD may be utilized for generating a picture as well, because the comparator CM serves only for contrast enhancement and noise suppression. It will also be understood that the display CRT need not contain a picture tube, but may utilize arbitrary registration means not only for phase analysis, but also for any of the above-described method.

The output signal of the AM demodulator AMD may be added to the x-deflection signal for the picture tube of the display CRT so as to generate a "waterfall" diagram. A similar display method is known in electron microscopy as y-modulation.

The use of a spectrometer SP is advantageous not only for voltage measurement, but also when a feedback loop is not employed but instead a constant voltage is supplied to the retarding field grid of an retarding field spectrometer. In such instances, the detector signal no longer results due to voltages contrasts at the surface of the test object IC, but due to the shift of the energy distribution of the secondary electrons. Disruptive influences of local fields are thereby suppressed.

Figure 7:
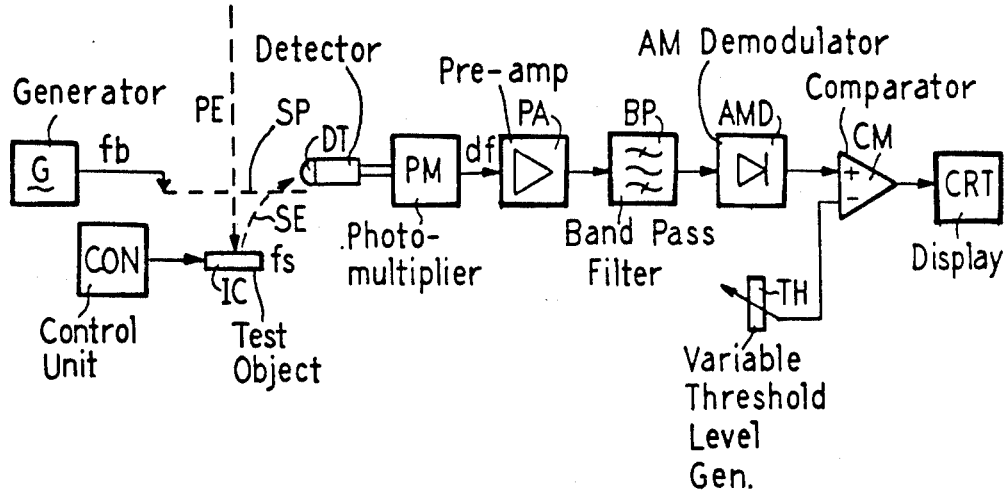
FIG. 7 is a schematic block diagram of a further embodiment of an apparatus constructed in accordance with the principles of the present invention wherein the secondary beam is modified.
Figure 8:
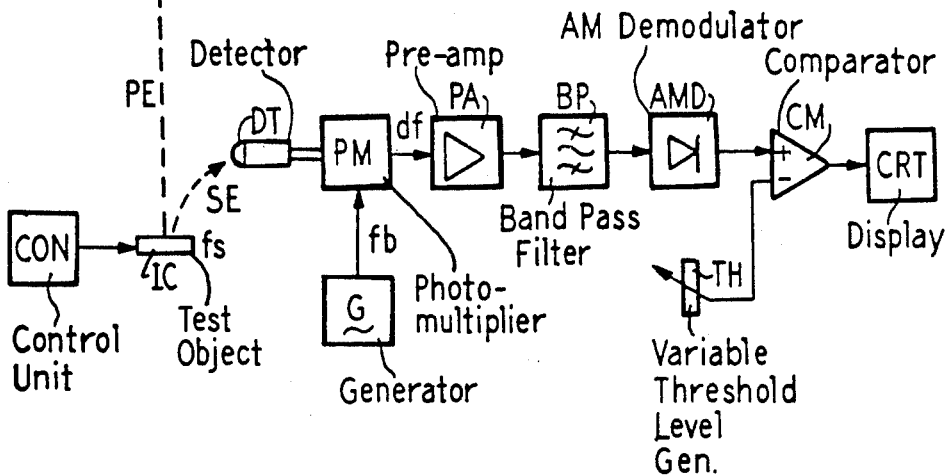
FIG. 8 is a schematic block diagram of a further embodiment of an apparatus constructed in accordance with the principles of the present invention wherein the secondary beam signal is modified.

As stated above, mixing to the fixed intermediate frequency is based open on a non-linear switch characteristic produced by pulsing or intensity-modulating of the primary electron beam PE. This may also be achieved if the secondary electrons or the secondary electron signal are pulsed modified by being or intensity-modulated instead of the primary electrons. This is possible, for example, if the energy threshold of an retarding field spectrometer is modulated with the frequency fb as shwon in FIG. 7. A sinusoidal modulation of the secondary electron signal may be achieved by making use of the spectrometer characteristic and thus possible difficulties with cross-modulation products, such as may appear under certain conditions in the described method are avoided. Such cross-modulation may occur if the primary electrons are, for example, also pulsed with rectangular signals. Because of the higher capacitances to be reloaded and the energy dispersion of the secondary electrons, the limit frequency is lower if the electronic signal resulting from the secondary electrons is modified, in which case one of the components in the signal processing circuit is pulsed, rather than pulsing the primary electron beam. Because the field of view is restricted by the spectrometer. Another alternative is to use the photomultiplier operated in combination with a generator for pulsing in the video signal path as shown in FIG. 8. In this case, however, the bandwidth is greatly restricted by the scintillator of the detector DT.

Although modifications and changes may be suggested by those skilled in the art it is the intention of the inventor to embody within the patent warranted hereon all changes and modifications as reasonably and properly come within the scope of his contribution to the art.

I claim as my invention:

1. A method for detecting and imaging a voltage signal present at at least one measuring location of a specimen carrying a signal of a first frequency fs comprising the steps of:
   generating a primary particle beam using a scanning particle microscope;
   directing said primary particle beam at said measuring location, said primary particle beam generating a secondary particle beam emanating from said measuring location;
   detecting particles in said secondary particle beam;
   generating an electronic secondary particle signal from the detected secondary beam particles;
   selecting one of said primary particle beam, said secondary particle beam or said secondary particle signal and modifying said selected one at a second frequency fb, where fb≠fs, so that said secondary particle signal is given a signal component having a differential frequency $df = fb - fs$;
   demodulating said signal component of said secondary particle signal having said frequency df; and
   recording the demodulated signal component.

2. A method as claimed in claim 1 comprising the additional step of filtering said secondary particle signal in a bandpass filter before demodulating said signal.

3. A method as claimed in claim 1 comprising the additional step of comparing the demodulated secondary paticle signal to a threshold voltage and displaying only demodulated secondary particle signals which exceed said threshold voltage.

4. A method as claimed in claim 1 wherein said scanning particle microscope has a display with a means for registration, and comprising the additional steps of:
   varying said modifying frequency at one measuring location among a plurality of different frequencies;
   supplying a signal to said means for registration identifying each of said plurality of modifying frequencies as each modifying frequency is used.

5. A method as claimed in claim 4 comprising the additional step of:
   generating a measured signal as a function of each modifying frequency as said different modifying frequencies are used and representing said measured signal on said display.

6. A method as claimed in claim 4 wherein the step of demodulating is undertaken in a demodulator having a bandwidth, and comprising the additional steps of:
passing said secondary particle signal through a bandpass filter having a bandwidth before demodulating said secondary particle signal;
periodically deflecting said primary particle beam over a plurality of different measuring locations; and
varying said modifying frequency by no more than the lesser of the bandwidth of the bandpass filter or the bandwidth of the demodulator for the time during which said primary particle beam is directed over all of said measuring locations.

7. A method as claimed in claim 4 comprising the additional steps of:
varying said modifying frequency among a plurality of different modifying frequencies at each measuring location; and
repeating the above step at each successive measuring location.

8. A method as claimed in claim 4 wherein the step of demodulating the secondary particle signal is undertaken in an AM demodulator having an analog output, and comprising the additional step of:
recording the analog output of said AM demodulator as a function of said modifying frequency.

9. A method as claimed in claim 4 comprising the additional steps of:
generating a signal as a function of said modifying frequency identifying the modifying frequency used; and
generating a signal identifying the location on said specimen at which the measuring location currently generating the secondary particle signal is situated.

10. A method as claimed in 1 wherein the step of demodulating the secondary particle signal is further defined by phase-demodulating said secondary particle signal.

11. A method as claimed in claim 10 wherein said phase-demodulation is undertaken in a phase demodulator and comprising the additional steps of:
simultaneously amplitude demodulating said secondary particle signal in an amplitude demodulator; and
switching the output of said phase demodulator controlled by the output of said amplitude demodulator.

12. An apparatus for detecting and imaging a voltage signal present at at least one measuring location of a specimen carrying a signal of a first frequency is comprising:
means for generating a primary particle beam;
means for directing said primary particle beam at said measuring location, said particle beam generating a secondary particle beam emanating from said measuring location;
means for detecting particles in said secondary particle beam;
means for generating an electronic secondary particle signal from the detected secondary beam particles;
means for modifying a selected one of said primary particle beam, said secondary particle beam or said secondary particle signal at a second frequency fb, where fb≠fs, so that said secondary particle signal is given a signal component having a differential frequency $df = fb - fs$;
means for demodulating said signal component of said secondary particle signal having said frequency df; and
means for recording the demodulated signal component.

13. An apparatus as claimed in claim 12 wherein said means for demodulating the secondary particle signal comprises:
a bandpass filter for filtering the component from said secondar particle signal having a frequency equal to the difference frequency; and
a demodulator for demodulating the output of said bandpass filter.

14. An apparatus as claimed in claim 13 wherein said demodulator is an amplitude demodulator.

15. An apparatus as claimed in claim 14 further comprising:
a comparator having one input connected to the output of said amplitude demodulator and another input connected to a means for setting a selected threshold such that only amplitude demodulated signals exceeding said threshold appear at the output of said comparator.

16. An apparatus as claimed in claim 12 wherein said means for modifying is a beam blanking system operating on said primary particle beam, and further comprising:
means for generating a ram signal for controlling the frequency of said beam blanking system;
means in said display for registration of a measured signal as a function of said ramp signal, said ramp signal being supplied to said means for registration;
a deflection coil surrounding said primary particle beam; and
a raster generator for controlling said deflection coil and connected to said means for registration for supplying a signal thereto as a function of the amount of deflection of said primary particle beam.

17. An improvement as claimed in claim 12 wherein said means for demodulating is a phase-locked loop and further comprising a means for controlling said phase-locked loop with a reference frequency which is said differential frequency.

18. An apparatus as claimed in claim 12 wherein said means for demodulating comprises:
a bandpass filter and an amplitude demodulator in said signal chain;
a phase demodulator, said secondary particle signal being supplied to said signal chain and to said phase demodulator for respective simultaneous demodulation therein; and
a switch connected to the output of said phase demodulator controlled by the output of said amplitude demodulator.

19. An apparatus as claimed in claim 12, wherein said means for modifying is a beam modulating system operating on said primary particle beam to intensity-modulate said primary particle beam, and further comprising:
means for generating a ramp signal for controlling the frequency of said beam modulating system;
means in said display for registration of a measured signal as a function of said ramp signal, said ramp signal being supplied to said means for registration;
a deflection coil surrounding said primary particle beam; and
a raster generator for controlling said deflection coil and connected to said means for registration for supplying a signal thereto as function of the amount of deflection of said primary particle beam.

20. A method for detecting and imaging a voltage signal present at at least one measuring location of a specimen carrying a signal of a first frequency fs comprising the steps of:
   generating a primary particle beam;
   directing said primary particle beam at said measuring location, said primary particle beam generating a secondary particle beam emanating from said measuring location;
   pulsing said primary particle beam at a second frequency fb, where fb≠fs:
   detecting particles in said secondary particle beam;
   generating an electronic secondary particle signal from the detected secondary particles beam, said secondary particle signal having a signal component having a differential frequency $df = fb - fs$ due to the pulsing of said primary particle beam;
   demodulating said signal component of said secondary particle signal having said frequency df; and
   recording the demodulated signal component.

21. A method for detecting and imaging a voltage signal present at at least one measuring location of a specimen carrying a signal of a first frequency fs comprising the steps of:
   generating a primary particle beam;
   directing said primary particle beam at said measuring location, said primary particle beam generating a secondary particle beam emanating from said measuring location;
   intensity-modulating said primary particle beam at a second frequency fb, where fb≠fs;
   detecting particles in said secondary particle beam;
   generating an electronic secondary particle signal from the detected secondary particles beam, said secondary particle signal having a signal component having a differential frequency $df = fb - fs$ due to the intensity-modulating of said primary particle beam;
   demodulating said signal component of said secondary particle signal having said frequency df; and
   recording the demodulated signal component.

22. A method for detecting and imaging a voltage signal present at at least one measuring location of a specimen carrying a signal of a first frequency fs comprising the steps of:
   generating a primary particle beam;
   directing said primary particle beam at said measuring location, said primary particle beam generating a secondary particle beam emanating from said measuring location;
   pulsing said secondary particle beam at a second frequency fb, where fb≠fs;
   detecting particles in said secondary particle beam;
   generating an electronic secondary particle signal from the detected secondary particles beam, said secondary particle signal having a signal component having a differential frequency $df = fb - fs$ due to the pulsing of said secondary particle beam;
   demodulating said signal component of said secondary particle signal having said frequency df; and
   recording the demodulated signal component.

23. A method for detecting and imaging a voltage signal present at at least one measuring location of a specimen carrying a signal of a first frequency fs comprising the steps of:
   generating a primary particle beam;
   directing said primary particle beam at said measuring location, said primary particle beam generating a secondary particle beam emanating from said measuring location;
   intensity-modulating said secondary particle beam at a second frequency fb, where fb≠fs;
   detecting particles in said secondary particle beam;
   generating an electronic secondary particle signal from the detected secondary particles beam, said secondary particle signal having a signal component having a differential frequency $df = fb - fs$ due to the intensity-modulating of said secondary particle beam;
   demodulating said signal component of said secondary particle signal having said frequency df; and
   recording the demodulated signal component.

24. A method for detecting and imaging a voltage signal present at at least one measuring location of a specimen carrying a signal of a first frequency fs comprising the steps of:
   generating a primary particle beam;
   directing said primary particle beam at said measuring location, said primary particle beam generating a secondary particle beam emanating from said measuring location;
   detecting particles in said secondary particle beam;
   generating an electronic secondary particle signal from the detected secondary beam particles;
   pulsing said secondary particle signal at a second frequency fb, where fb≠fs, so that said secondary particle signal is given a signal component having a differential frequency $df = fb - fs$;
   demodulating said signal component of said secondary particle signal having said frequency df; and
   recording the demodulated signal component.

25. An apparatus for detecting and imaging a voltage signal present at at least one measuring location of a specimen carrying a signal of a first frequency fs comprising:
   means for generating a primary particle beam;
   means for directing said primary particle beam at said measuring location, said primary particle beam generating a secondary particle beam emanating from said measuring location;
   means for pulsing said primary particle beam at a second frequency fb, where fb≠fs;
   means for detecting particles in said secondary particle beam;
   means for generating an electronic secondary particle signal from the detected secondary particles beam, said secondary particle signal having a signal component having a differential frequency $df = fb - fs$ due to the pulsing of said primary particle beam;
   means for demodulating said signal component of said secondary particle signal having said frequency df; and
   means for recording the demodulated signal component.

26. An apparatus for detecting and imaging a voltage signal present at at least one measuring location of a specimen carrying a signal of a first frequency fs comprising:
   means for generating a primary particle beam;
   means for directing said primary particle beam at said measuring location, said primary particle beam generating a secondary particle beam emanating from said measuring location;

means for intensity-modulating said primary particle beam at a second frequency fb, where fb≠fs;

means for detecting particles in said secondary particle beam;

means for generating an electronic secondary particle signal from the detected secondary particles beam, said secondary particle signal having a signal component having a differential frequency $df = fb - fs$ due to the intensity-modulating of said primary particle beam;

means for demodulating said signal component of said secondary particle signal having said frequency df; and means for recording the demodulated signal component.

27. An apparatus for detecting and imaging a voltage signal present at at least one measuring location of a specimen carrying a signal of a first frequency fs comprising:

means for generating a primary particle beam;

means for directing said primary particle beam at said measuring location, said primary particle beam generating a secondary particle beam emanating from said measuring location;

means for pulsing said secondary particle beam at a second frequency fb, where fb≠fs;

means for detecting particles in said secondary particle beam;

means for generating an electronic secondary particle signal from the detected secondary particles beam, said secondary particle signal having a signal component having a differential frequency $df = fb - fs$ due to the pulsing of said secondary particle beam;

means for demodulating said signal component of said secondary particle signal having said frequency df; and means for recording the demodulated signal component.

28. An apparatus for detecting and imaging a voltage signal present at at least one measuring location of a specimen carrying a signal of a first frequency fs comprising:

means for generating a primary particle beam;

means for directing said primary particle beam at said measuring location, said primary particle beam generating a secondary particle beam emanating from said measuring location;

means for intensity-modulating said secondary particle beam at a second frequency fb, where fb≠fs;

means for detecting particles in said secondary particle beam;

means for generating an electronic secondary particle signal from the detected secondary particles beam, said secondary particle signal having a signal component having a differential frequency $df = fb - fs$ due to the intensity-modulating of said secondary particle beam;

means for demodulating said signal component of said secondary particle signal having said frequency df; and means for recording the demodulated signal component.

29. An apparatus for detecting and imaging a voltage signal present at at least one measuring location of a specimen carrying a signal of a first frequency fs comprising:

means for generating a primary particle beam;

means for directing said primary particle beam at said measuring location, said primary particle beam generating a secondary particle beam emanating from said measuring location;

means for detecting particles in said secondary particle beam;

means for generating an electronic secondary particle signal from the detected secondary beam particles;

means for pulsing said secondary particle signal at a second frequency fb, where fb≠fs, so that said secondary particle signal is given a signal component having a differential frequency $df = fb - fs$;

means for demodulating said signal component of said secondary particle signal having said frequency df; and means for recording the demodulated signal component.

* * * * *